(12) United States Patent
Choi et al.

(10) Patent No.: US 7,249,627 B2
(45) Date of Patent: Jul. 31, 2007

(54) COOLING DEVICE OF HYBRID-TYPE

(75) Inventors: Jae Joon Choi, Seongnam-si (KR);
Jihwang Park, Seoul (KR); Jeong Hyun Lee, Gwacheon-si (KR)

(73) Assignee: Icurie Lab Holdings Limited, London (GB)

( * ) Notice: Subject to any disclaimer, the term of this patent is extended or adjusted under 35 U.S.C. 154(b) by 199 days.

(21) Appl. No.: 10/543,417

(22) PCT Filed: Oct. 28, 2003

(86) PCT No.: PCT/KR03/02282

§ 371 (c)(1),
(2), (4) Date: Jul. 25, 2005

(87) PCT Pub. No.: WO2004/065866

PCT Pub. Date: Aug. 5, 2004

(65) Prior Publication Data

US 2006/0266499 A1    Nov. 30, 2006

(30) Foreign Application Priority Data

Jan. 24, 2003  (KR) .................... 10-2003-0004932

(51) Int. Cl.
  *F28D 15/02* (2006.01)
(52) U.S. Cl. ................. 165/121; 165/80.3; 165/104.21
(58) Field of Classification Search ............... 165/121, 165/125, 80.2, 80.3, 104.21, 104.26, 104.33, 165/104.34
See application file for complete search history.

(56) References Cited

U.S. PATENT DOCUMENTS

2004/0040695 A1*  3/2004  Chesser et al. ......... 165/104.21

FOREIGN PATENT DOCUMENTS

| JP | 7-318269 | 12/1995 |
| JP | 9-113058 | 5/1997 |
| JP | 11-63722 | 3/1999 |
| JP | 11-121816 | 4/1999 |
| JP | 2001-201233 | 7/2001 |

* cited by examiner

*Primary Examiner*—Teresa J. Walberg
(74) *Attorney, Agent, or Firm*—Thelen Reid Brown Raysman & Steiner LLP

(57) ABSTRACT

The present invention provides a hybrid-type cooling device which can perform cooling by phase transition, ventilation and convection.

28 Claims, 9 Drawing Sheets

【Fig.1】
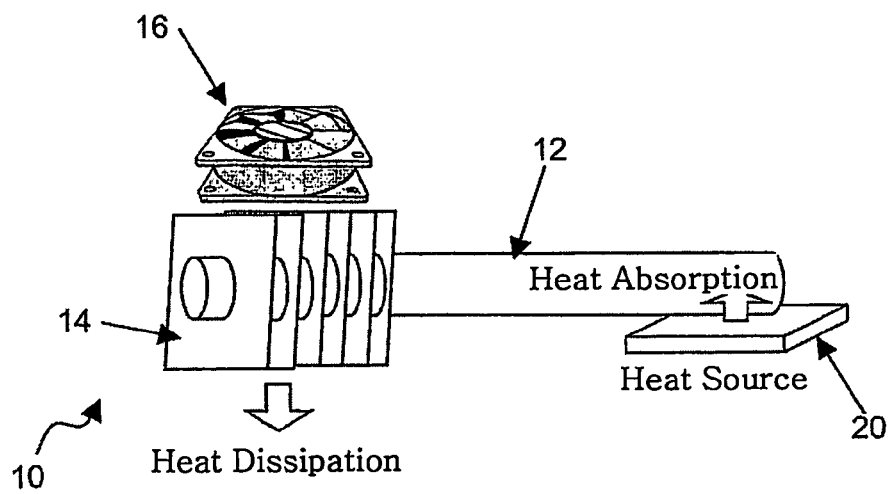
【Fig.2】
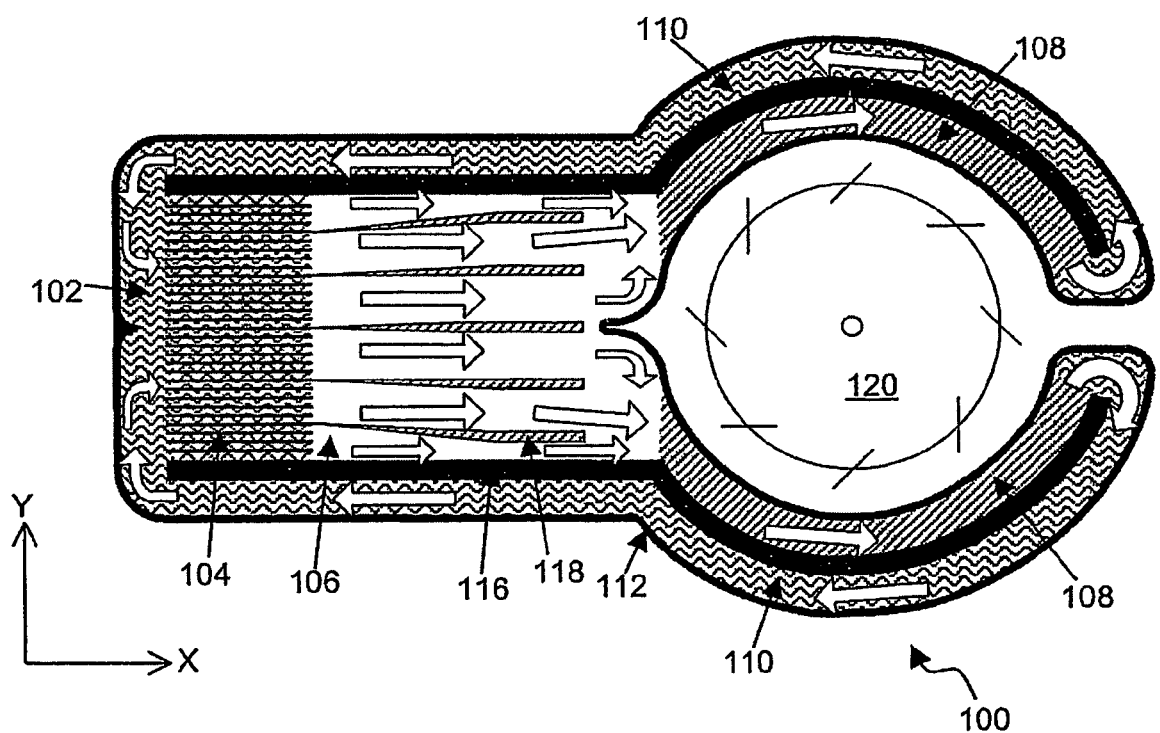

[Fig.3]
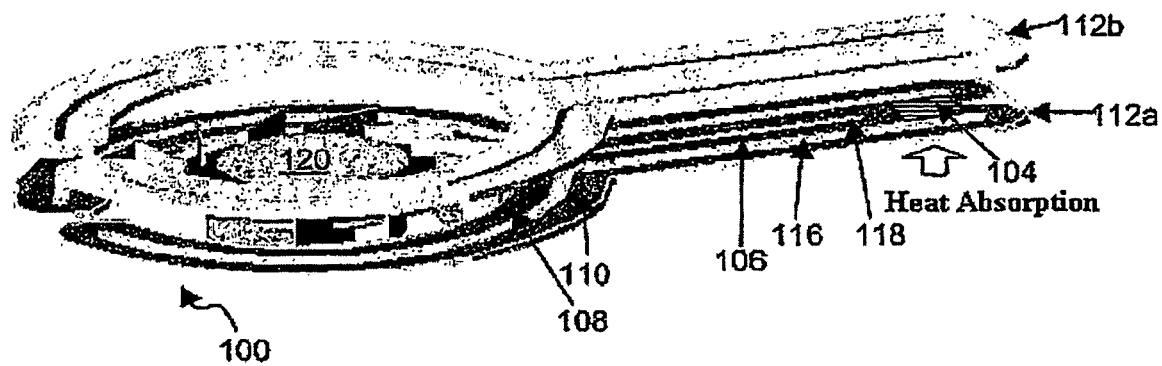
[Fig.4a]
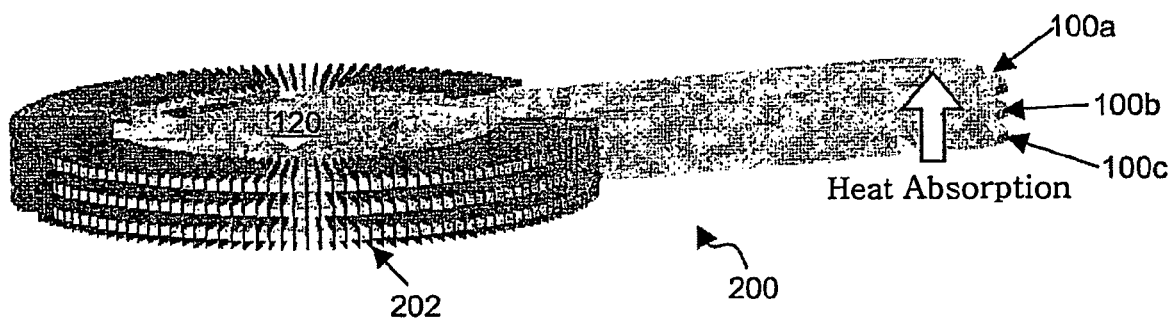
[Fig.4b]
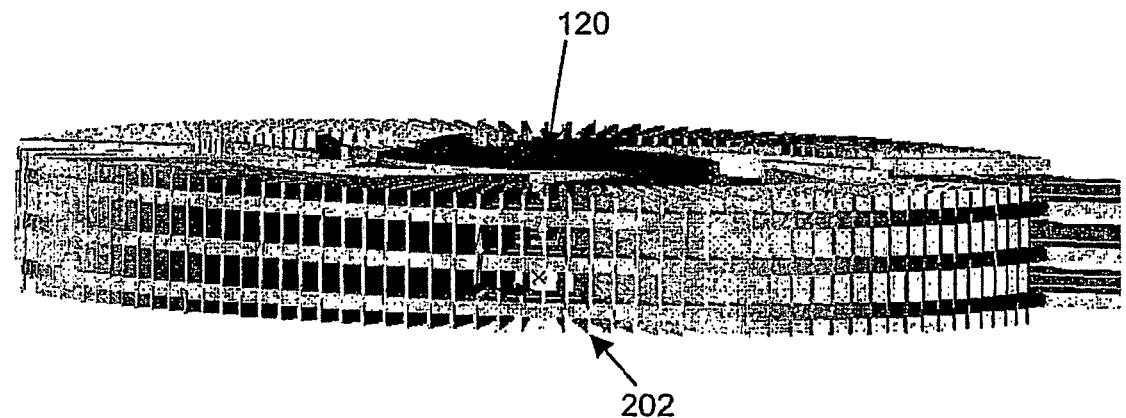

[Fig.5a]
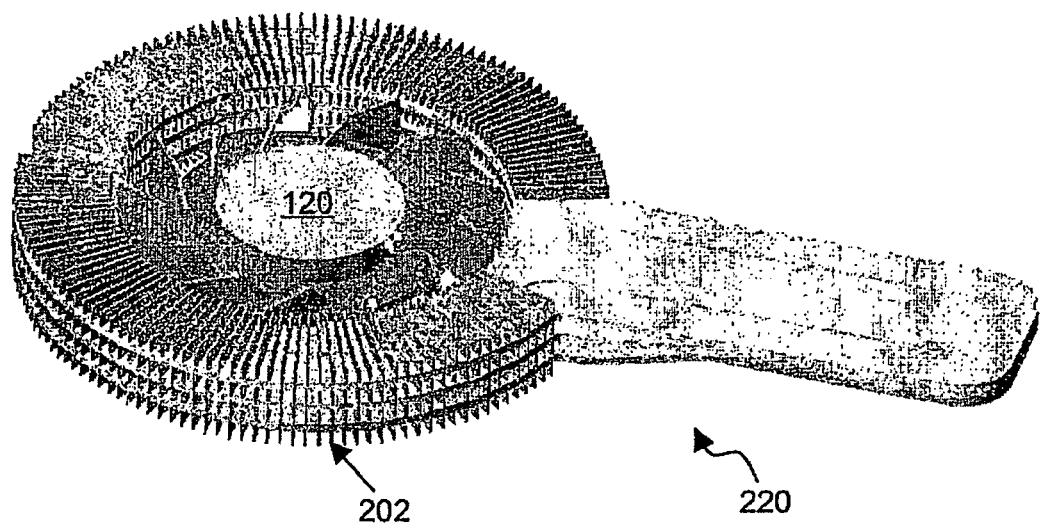
[Fig.5b]
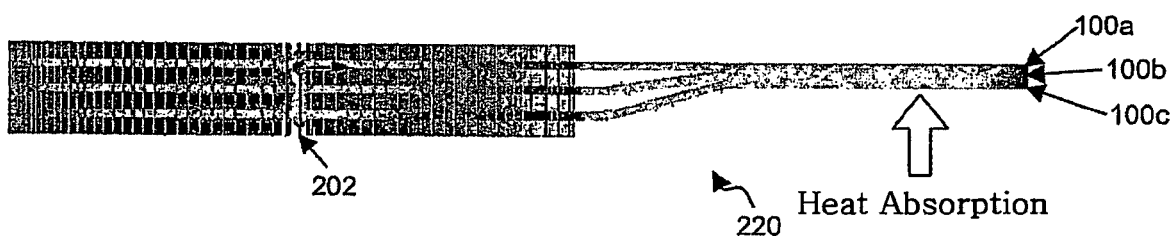

[Fig.6a]
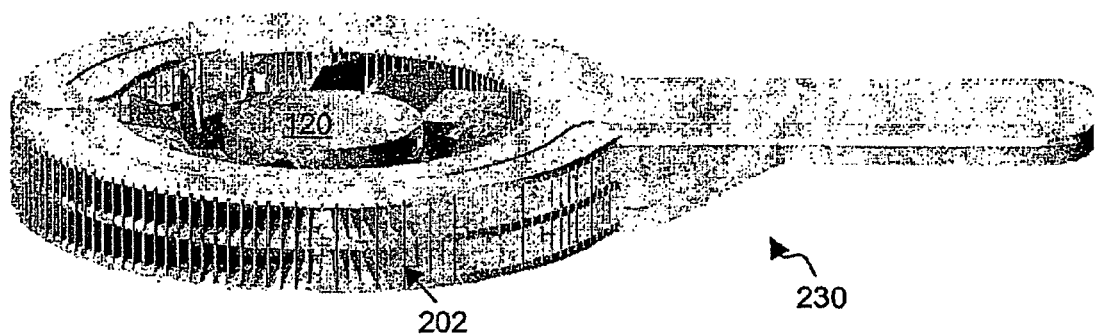
[Fig.6b]
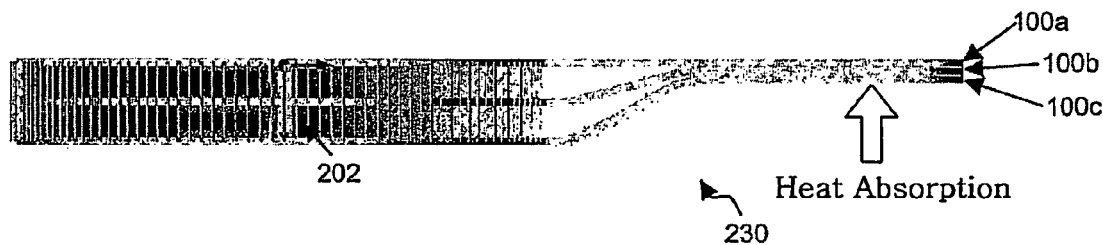
[Fig.7]
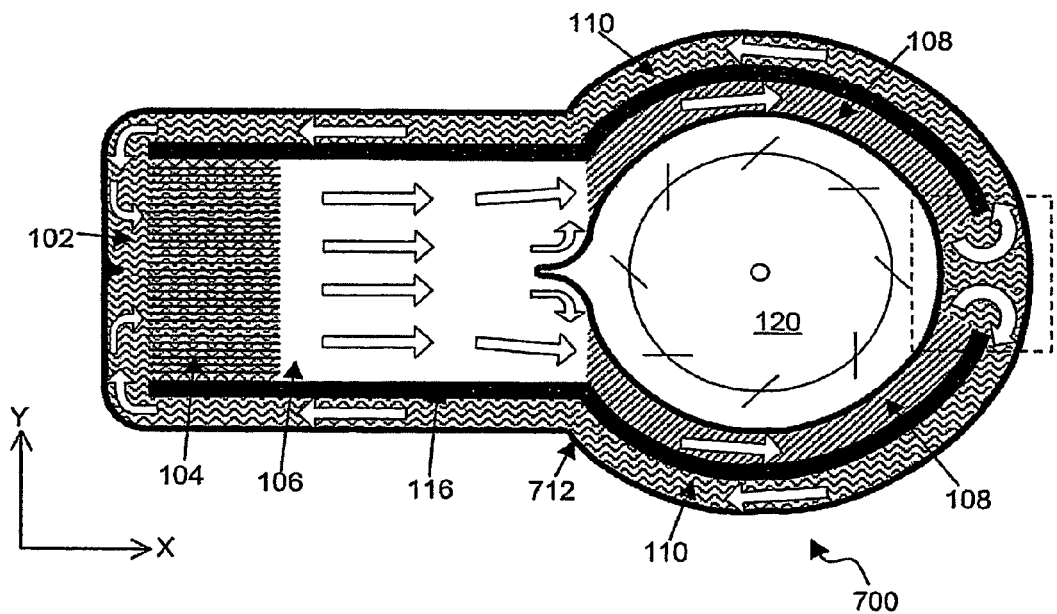

[Fig.8]
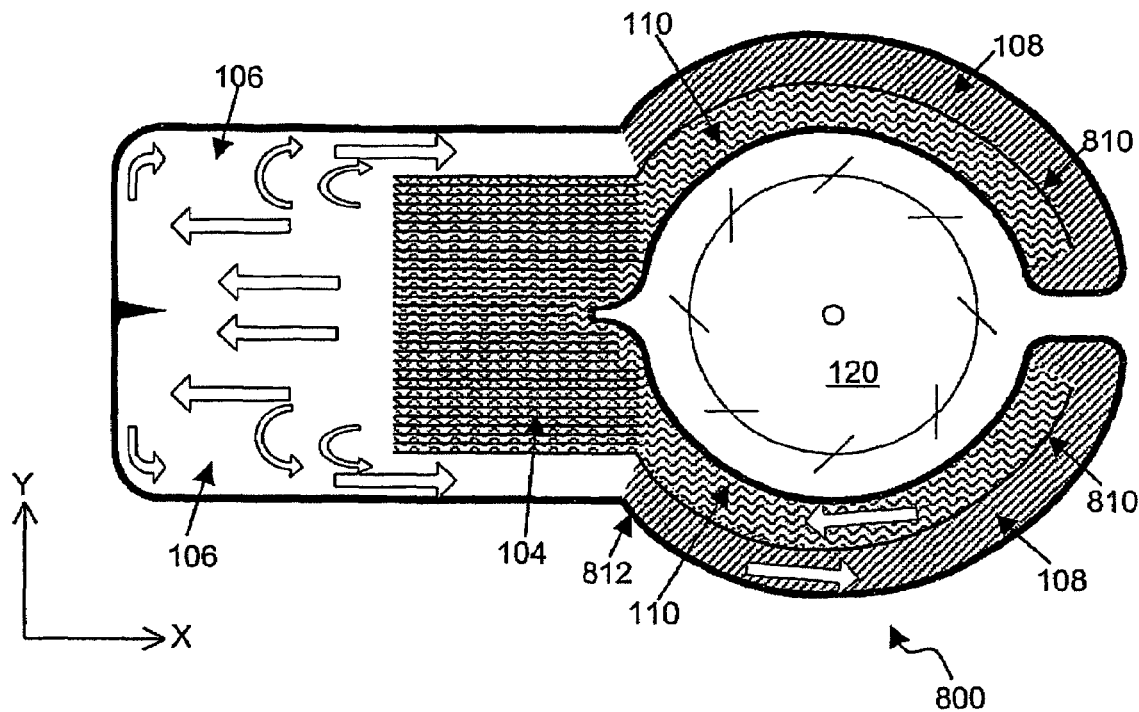
[Fig.9]
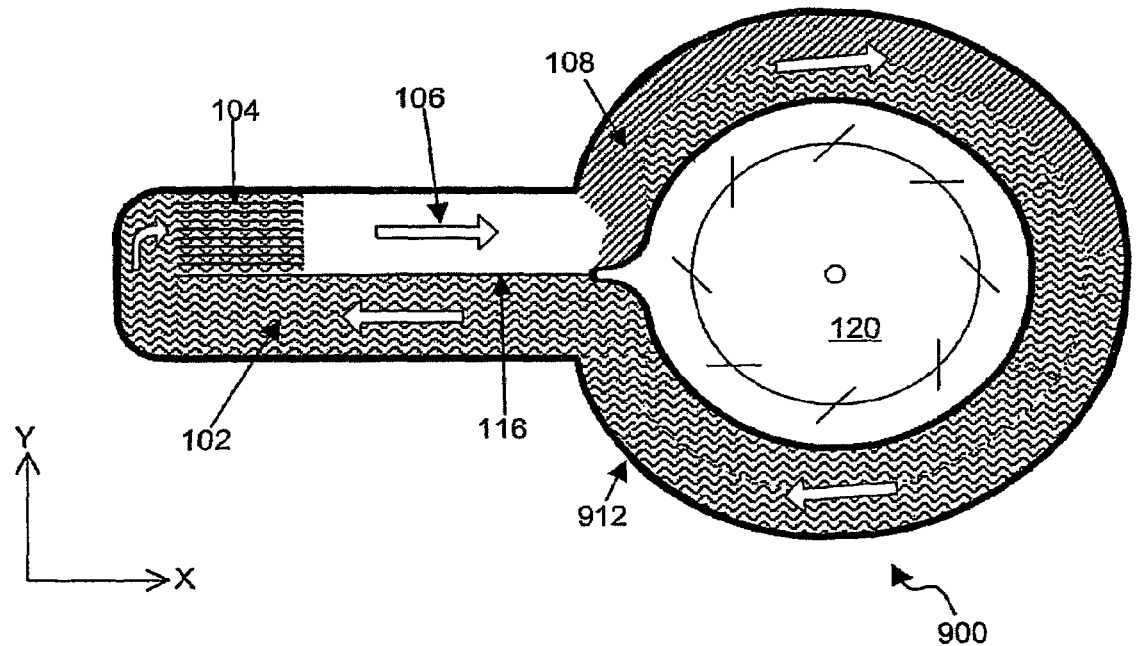

[Fig.10]
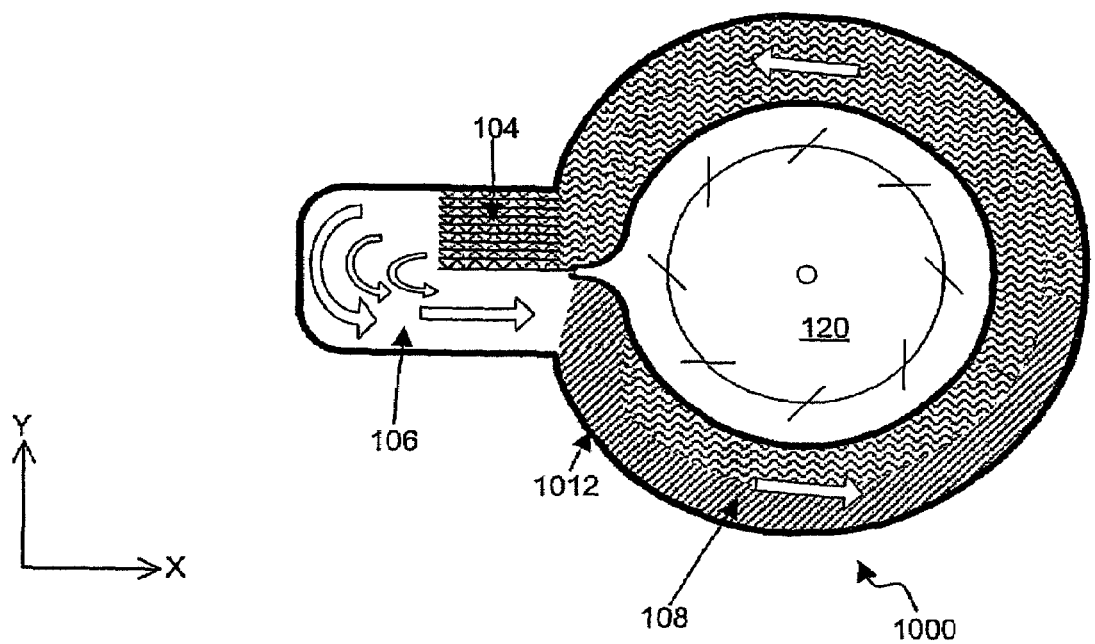
[Fig.11]
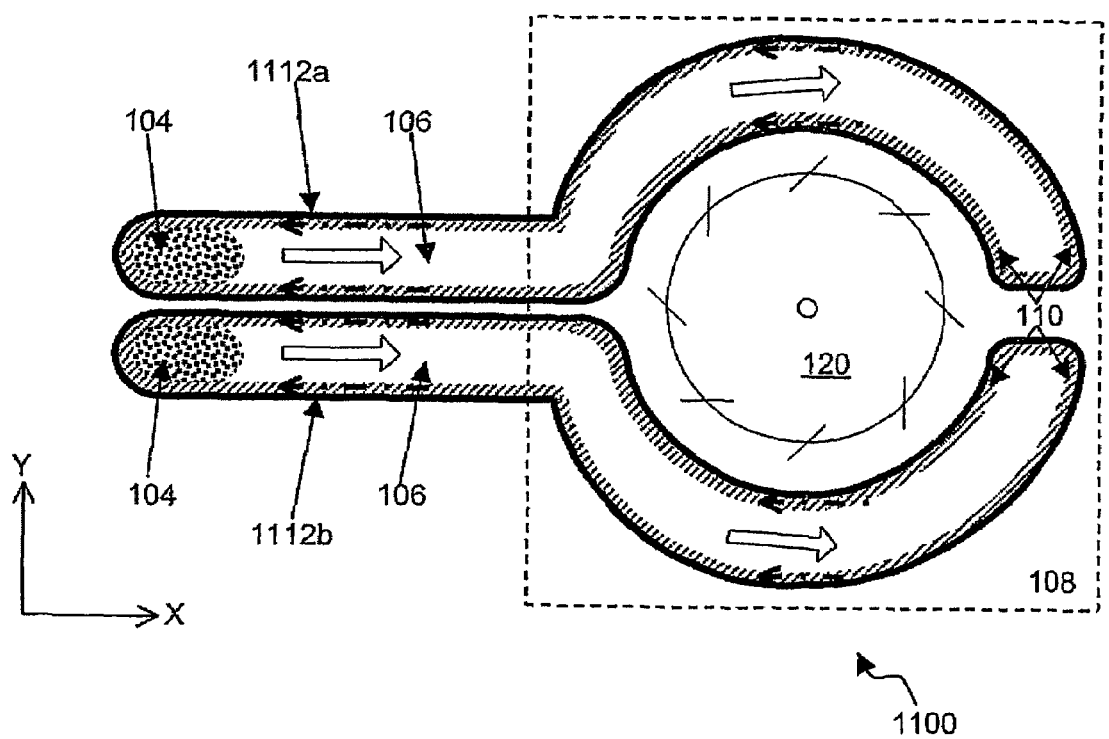

[Fig.12a]
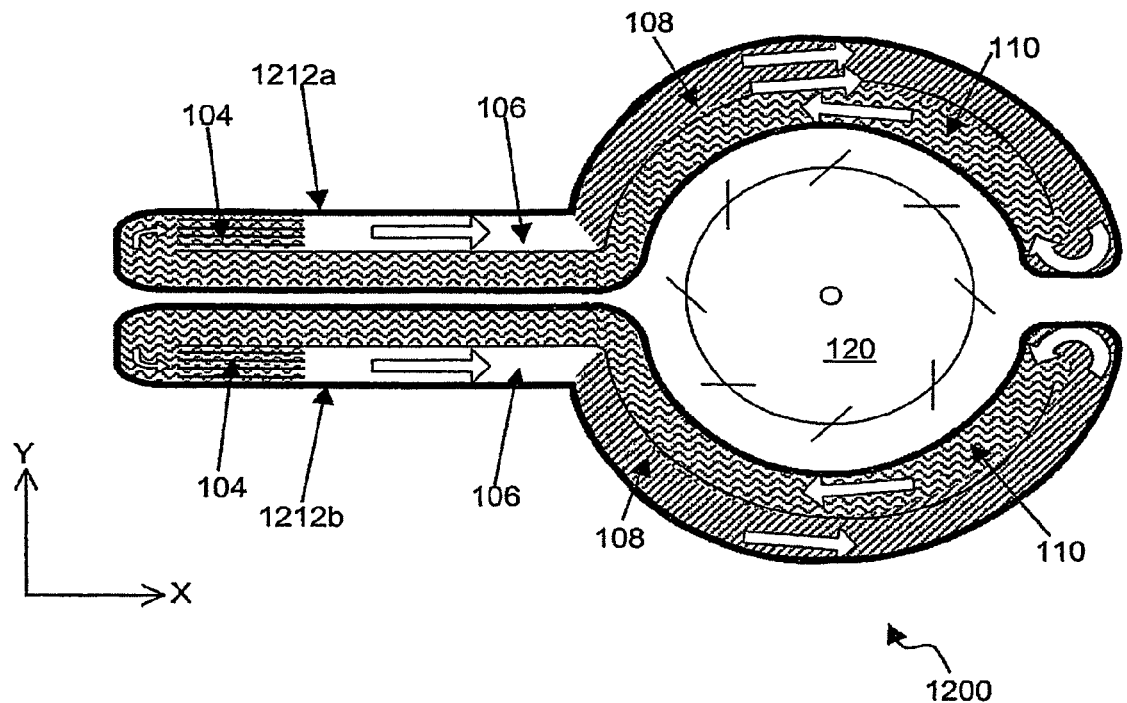
[Fig.12b]
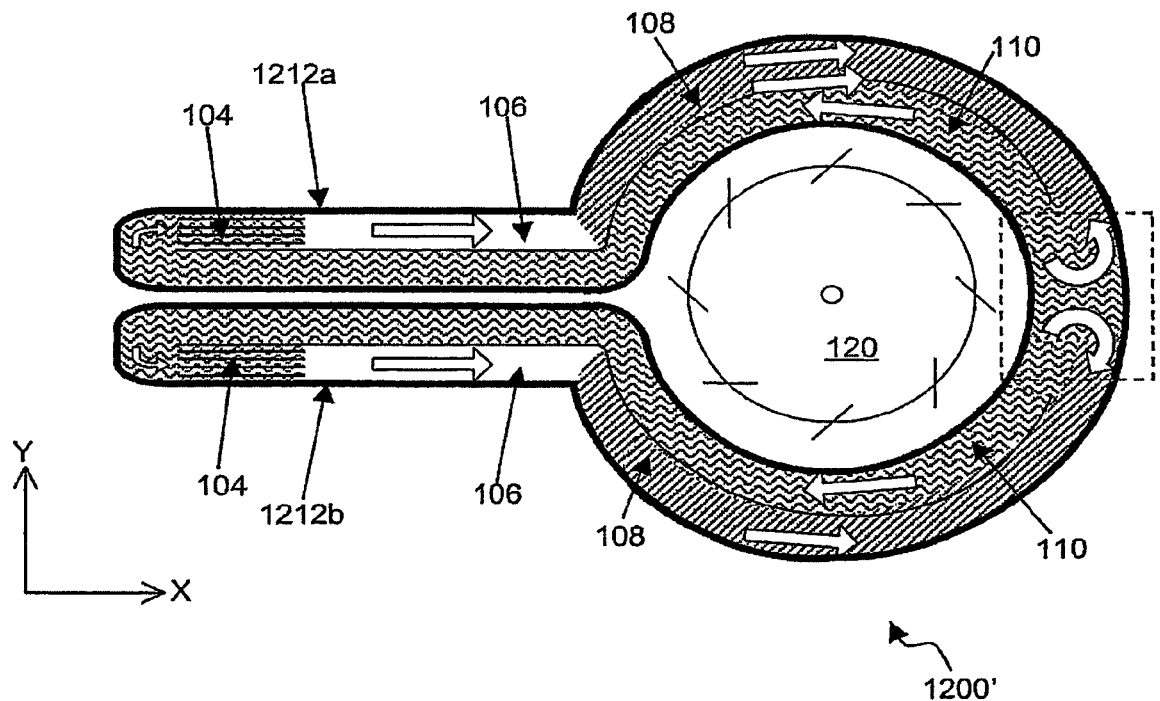

[Fig.13a]
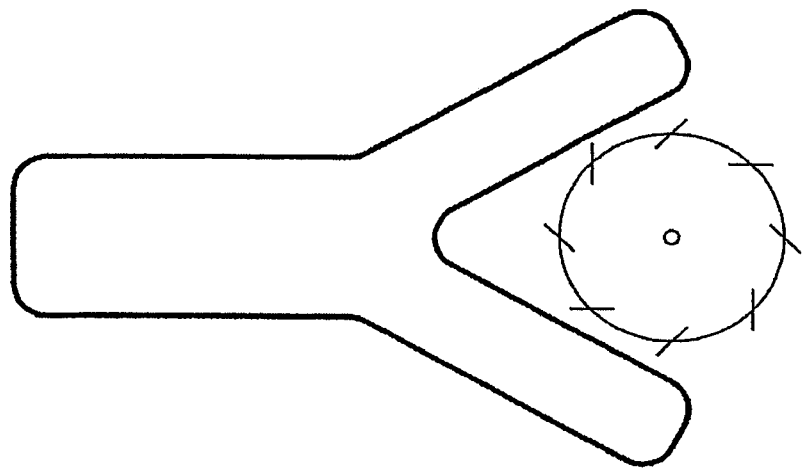
[Fig.13b]
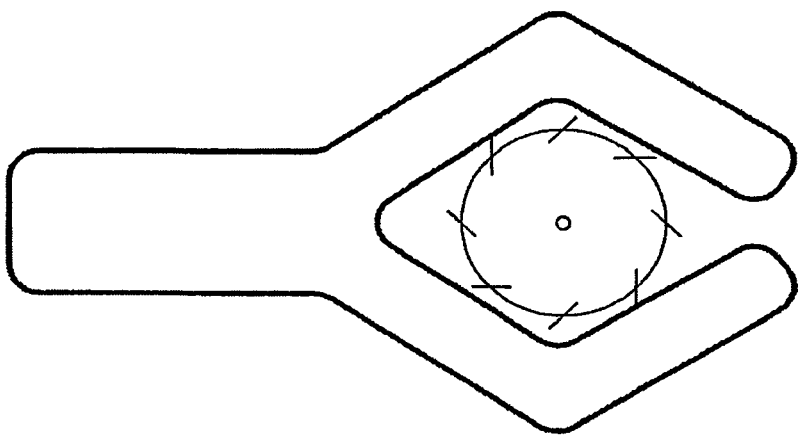
[Fig.13c]
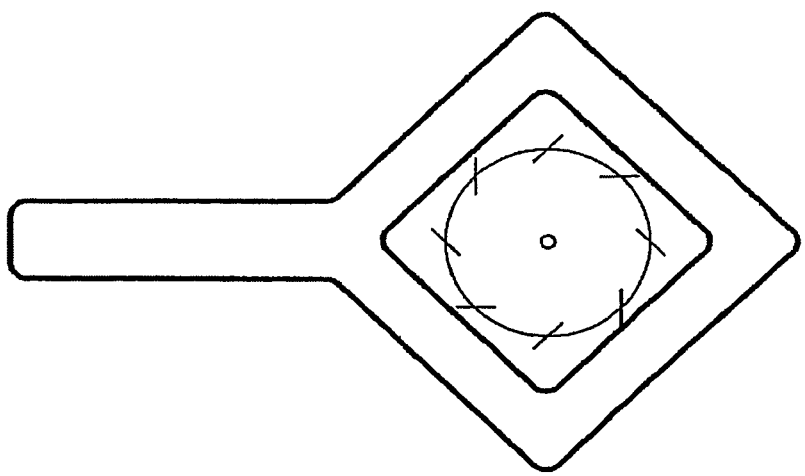

[Fig.13d]
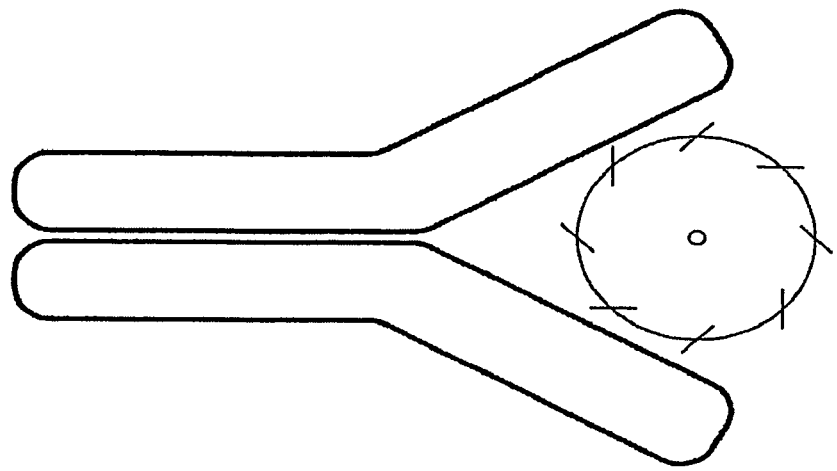
[Fig.13e]
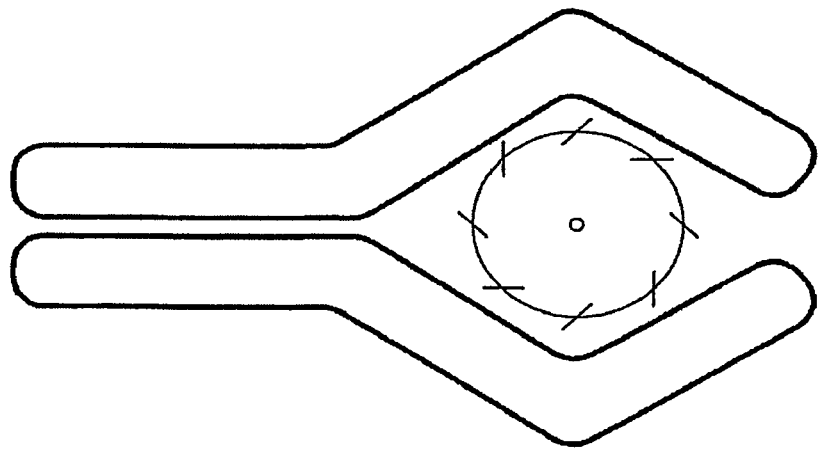
[Fig.13f]
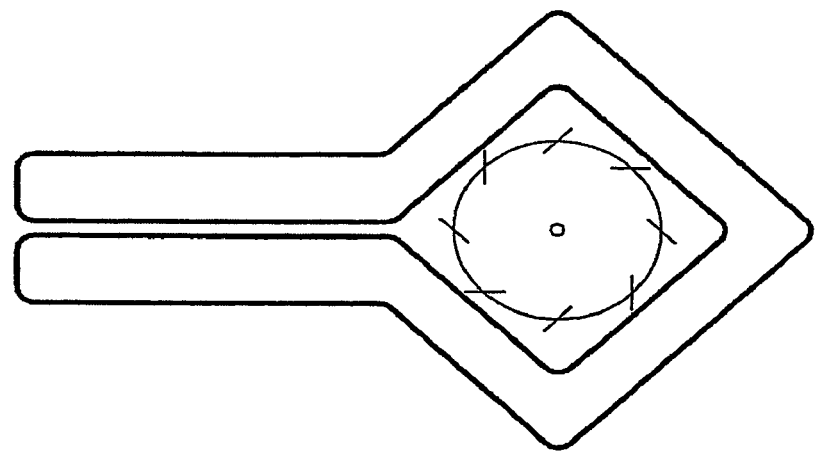

US 7,249,627 B2

COOLING DEVICE OF HYBRID-TYPE

CROSS REFERENCE TO RELATED APPLICATION

This application claims priority based on International Patent Application No. PCT/KR2003/002282, entitled "Cooling Device of Hybrid-Type" by Jae Joon CHOI, Jihwang PARK, and Jeong Hyun Lee, which claims priority of Korean Application No. 10-2003-0004932, filed on Jan. 24, 2003.

TECHNICAL FIELD

The present invention relates to a cooling device for cooling a semiconductor integrated circuit device, etc., and more particularly to a hybrid (or composite) cooling device adopting both cooling systems based on phase transition of moving fluid and a fin and/or fan.

BACKGROUND ART

As design rule decreases due to the trend towards large scale integration of semiconductor devices, and thereby the line width of electronic devices constituting semiconductor devices narrows, small-sized and high performance electronic equipment has been achieved owing to a larger number of transistors per unit area, which causes, however, that the ratio of heat emission of a semiconductor device per unit area increases. The increase of the rate of heat emission deteriorates the performance of semiconductor devices and lessens the life expectancy thereof, and eventually decreases the reliability of a system adopting semiconductor devices. Particularly in semiconductor devices, parameters are too easily affected by operation temperatures, and thereby that further deteriorates properties of integrated circuits.

In response to the increase of the rate of heat emission, cooling technologies have been developed such as fin-fan, peltier, water-jet, immersion, heat pipe type coolers, etc., which are generally known.

The fin-fan type cooler which compulsorily cools devices using fins and/or fans has been used for tens of years, but has some defects such as noise, vibration, and low cooling efficiency compared to its large volume. Although the peltier type cooler doesn't make noise or vibration, it has a problem that it requires too many heat dissipation devices at its hot junction needing large driving power in accordance with the law of conservation of energy. The water-jet type cooler goes mainstream in cooling device research because of its efficiency, but its structure is complicated due to the use of a thin film pump driven by an external power supply, and it is significantly affected by gravity, as well as a problem that it is difficult to achieve robust design when applied to personal mobile electronic equipment.

Due to above problems, the heat pipe type cooler is recently widely applied in various shapes as a compact type cooling device together with the fin-fan type cooler because its advantages that it is simple in structure and easily manufactured. That is, as shown in FIG. 1, a conventional cooling device 10 combining both heat pipe and fin-fan includes a heat pipe 12 contacting a heat source 20 at one end thereof, a plurality of fins 14 being disposed at the other end of the heat pipe 12, and a fan 16 being disposed near the fins 14, whereby the heat absorbed from the heat source 20 is dissipated by the fins 14.

In the cooling device 10 using such heat pipe, since the flowing directions of gas and liquid are opposite each other, it dries out when a large quantity of heat is applied to the heat pipe, because the liquid returning to an evaporation section from a condensation section is sucked again into a gas transfer section due to the speed of the gas generated, so that it eventually fails to return to the evaporation section. In addition, there is a problem that its installation location is significantly restricted because the evaporated refrigerant is transferred depending on the difference between buoyancy and pressure in the heat pipe, and the liquefied refrigerant in the heat pipe depends on gravity due to the structure and size of the medium of the returning section.

Further, since the amount of heat produced by a highly integrated semiconductor device such as an up-to-date CPU is so large that the conventional cooling device cannot deal with the heat, even the cooling device 10 combining heat pipe and fin-fan can manage to cool only when equipped with three or four of the heat pipes 12 and two or more of the fans 16. If the elements increase as above, the size of the device becomes too large, and besides noise and power consumption by lots of the fans 16 also increase considerably, so that it isn't useful any more. The disadvantage of the convention heat pipe type cooler as above is that the loss of heat transfer at the fins themselves rapidly drops in comparison to the heat transfer at the phase transition medium, because it has to transfer heat through fins of large area even though utilizing phase transition of fluid.

DISCLOSURE OF INVENTION

In order to solve the problems above, it is an object of the present invention to provide a compact type hybrid cooling device for performing cooling both by latent heat during phase transition and by ventilation and convection.

In addition, it is another object of the present invention to provide a compact type hybrid cooling device capable of improving cooling performance by minimizing the loss of heat transfer through fins, as the hybrid cooling device is disposed between the fins.

In addition, it is further another object of the present invention to provide a compact type hybrid cooling device capable of performing cooling regardless of the effect of gravity.

In addition, it is further another object of the present invention to provide a compact type hybrid cooling device without restriction in installation location.

In order to achieve the objects above, a hybrid cooling device for cooling heat from an external heat source, includes a phase transition cooler in which a circulation loop of a refrigerant capable of phase transition is formed, the phase transition cooler including a branching section at one side thereof, and a fan being disposed in the branching section of the phase transition cooler, wherein the phase transition cooler includes an evaporation section being formed at one end of the phase transition cooler, where the liquid state refrigerant is accumulated by capillary action in at least a part of the evaporation section, and the accumulated liquid state refrigerant is evaporated by heat transferred from the external heat source, a gaseous state refrigerant transfer section being formed adjacent to the evaporation section, where the evaporated refrigerant is transferred towards the branching section, a condensation section being formed adjacent to the gaseous state refrigerant transfer section as at least a part of the branching section and dividing into at least two branches, where the gaseous state refrigerant is condensed into a liquid state, a liquid state refrigerant transfer section being formed adjacent to the condensation section as at least a part of the branching section and thermally insulated from the evaporation section, where the liquefied refrigerant is transferred towards the evaporation section, and a thermal insulation section for thermally insulating at least a part of the evaporation section from the liquid state refrigerant transfer section.

BRIEF DESCRIPTION OF DRAWINGS

FIG. 1 schematically shows an example of a conventional heat pipe type cooling device.

FIG. 2 shows a horizontally cross-sectional view of a hybrid cooling device according to a first embodiment of the present invention.

FIG. 3 shows an exploded perspective view of a hybrid cooling device 100 in FIG. 2.

FIG. 4a shows a perspective view of a hybrid cooling device 200 according to a second embodiment of the present invention.

FIG. 4b shows an enlarged perspective view of a condensation section of a hybrid cooling device 200 in FIG. 4a.

FIG. 5a shows a perspective view of a hybrid cooling device 220 according to a third embodiment of this invention.

FIG. 5b is a side view of a hybrid cooling device 220 in FIG. 5a.

FIG. 6a shows a perspective view of a hybrid cooling device 230 according to a fourth embodiment of this invention.

FIG. 6b is a side view of a hybrid cooling device 230 in FIG. 6a.

FIG. 7 shows a horizontally cross-sectional view of a hybrid cooling device according to a fifth embodiment of this invention.

FIG. 8 shows a horizontally cross-sectional view of a hybrid cooling device according to a sixth embodiment of this invention.

FIG. 9 shows a horizontally cross-sectional view of a hybrid cooling device according to a seventh embodiment of this invention.

FIG. 10 shows a horizontally cross-sectional view of a hybrid cooling device according to an eighth embodiment of this invention.

FIG. 11 shows a horizontally cross-sectional view of a hybrid cooling device according to a ninth embodiment of this invention.

FIGS. 12a and 12b show horizontally cross-sectional views of a hybrid cooling device according to tenth and eleventh embodiments of this invention.

FIGS. 13a and 13f show hybrid cooling devices according to other embodiments of this invention.

BEST MODE FOR CARRYING OUT THE INVENTION

Hereinafter, exemplary embodiments of the present invention will now be described in detail with reference to attached drawings.

FIG. 2 shows a horizontally cross-sectional view of a hybrid cooling device according to a first embodiment of the present invention. As shown in FIG. 2, the hybrid cooling device 100 of this embodiment includes a phase transition cooler 112 in which a circulation loop of a refrigerant capable of phase transition is formed, in at least a part of the circulation loop including a section (hereinafter, "branching section") in the shape of a hollow ring, and a fan 120 being disposed in the hollow of the branching section of the phase transition cooler.

A housing of the phase transition cooler 112 can be manufactured of a material such as semiconductor, e.g. Si, Ga, etc., a novel substance-laminated material, e.g. Self Assembled Monolayer (SAM), metal and/or alloy, e.g. Cu, Al, etc. with high conductivity, ceramic, a high molecular substance, e.g. plastic, a crystalline material, e.g. diamond. Particularly, in case of a semiconductor chip as the external heat source, the housing can be made of the same material as that of the surface of the external source so as to minimize the thermal contact resistance. In case that the phase transition cooler 112 is made of semiconductor, the housing can be integrally formed as one piece with the surface of the external source during the process of manufacturing the semiconductor chip.

Next, the refrigerant to be injected into the phase transition cooler 112 can be selected from things capable of phase transition between liquid and gaseous states, due to external heat. In this embodiment, it is preferable to use water whose latent heat and surface tension are high as the refrigerant, because it is desirable not to use any of a series of CFC as the refrigerant in consideration of environmental pollution. In addition, since the surface tension between the refrigerant and an inner wall of the phase transition cooler 112 changes depending upon the material of the housing, a suitable refrigerant should be selected. For example, any of a series of alcohol such as methanol, ethanol, etc., may be used as the refrigerant besides water. In case of water or alcohol as the refrigerant, it has an advantage that a large amount of heat can transferred because its heat capacity is large, and its contact angle by the surface tension with the inner wall of semiconductor is small, so that the current speed of the refrigerant becomes high. Moreover, water or alcohol as the refrigerant, unlike CFC, does not cause any environmental pollution even though it leaks from the phase transition cooler 112 by any reason.

The selection of the refrigerant is merely of an optional matter for implementation of this invention, which does not limit the technical scope of this invention.

As shown in FIG. 2, the phase transition cooler 112 includes an evaporation section 104 being formed at one end thereof, where the liquid state refrigerant is accumulated by capillary action, and the accumulated liquid state refrigerant is evaporated by the heat transferred from an external heat source, a gaseous state refrigerant transfer section 106 being formed adjacent to the evaporation section 104, where the evaporated refrigerant is transferred by a pressure difference thereof, a condensation section 108 being formed adjacent to the gaseous state refrigerant transfer section 106 and dividing into two branches, where the gaseous state refrigerant is condensed into a liquid state, and liquid state refrigerant transfer sections 102 and 110 being formed adjacent to the condensation section 108 and thermally insulated from the evaporation section 104, where the liquefied refrigerant is transferred towards the evaporation section 104. In this embodiment, the condensation section 108 and the liquid state refrigerant transfer section 110 constitutes the branching section.

The refrigerant inside the phase transition cooler 112 forms the circulation loop in the direction of the arrow shown in FIG. 2. In other words, the refrigerant circulates via the evaporation section 104, the gaseous state refrigerant transfer section 106, the condensation section 108, the liquid state refrigerant transfer section 110, and the liquid state refrigerant transfer section 102 sequentially.

Alternatively, the phase transition cooler 112 may further include a refrigerant storage section (not shown) whose volume is suitable for storing a predetermined amount of the liquid state refrigerant in the liquid state refrigerant transfer sections 102 and 110. For example, a part of the liquid state refrigerant transfer section 102 near the evaporation section may be used for the refrigerant storage section.

The evaporation section 104 is adjacent to one end ("exit side") of the liquid state refrigerant transfer section 102 near the evaporation section, and a plurality of tiny channels are formed in the evaporation section 104, so that all or a part of the tiny channels are filled with the refrigerant stored in the liquid state refrigerant transfer section 102 near the evaporation section by capillary action. And the evaporation section 104 is disposed adjacent to an external heat source (not shown), and thereby the liquid state refrigerant accumulated in the tiny channels by the heat transferred form the heat source is evaporated, so it changes into the gaseous state. Accordingly, the heat from the heat source is absorbed to the refrigerant as much as the latent heat caused by the phase transition of the refrigerant, and the heat from the heat source can be lessened by condensing the gaseous refrigerant as described later.

It is preferable that the surface tension in the tiny channels be larger than gravity. In addition, the smaller the contact angle of the meniscus of the liquid state refrigerant accumulated in the tiny channels, the more it is preferable. In order to do so, it is preferable that the inner walls of the tiny channels be formed of or treated with a hydrophilic material. For example, the hydrophilic material treatment is performed by plating, coating, coloring, anodization, plasma treatment, laser treatment, etc. In addition, the surface coarseness of the inner walls of the tiny channels can be adjusted in order to improve the rate of heat transfer, which is preferably within the range of about 1 Å to 100 μm.

Further, the cross-sections of the tiny channels may be circular, elliptical, rectangular, square, polygonal, etc. Particularly, the magnitude of the surface tension of the refrigerant can be controlled by increasing or decreasing the cross-sections of the tiny channels in the longitudinal direction thereof (i.e., X axis), the transfer direction and velocity of the refrigerant can also be controlled by forming a plurality of grooves or nodes on the inner wall thereof.

Next, the refrigerant evaporated in the evaporation section 104 is transferred in the opposite direction to the liquid state refrigerant transfer section 102 near the evaporation section, and the gaseous state refrigerant transfer section 106 is formed adjacent to the evaporation section 104 to function as a passage through the gaseous state refrigerant is transferred. As shown in the drawing, the gaseous state refrigerant transfer section 106 may include a plurality of guides 118 so that the evaporated refrigerant can be transferred in a predetermined direction (i.e., in the opposite direction to the refrigerant storage section 102). The guides 118 have the function of increasing the mechanical strength of the phase transition cooler 112. Accordingly, the guides 118 may not be included if there is no problem in the mechanical strength.

The condensation section 108 is the area where the gaseous state refrigerant being transferred inwards through the gaseous state refrigerant transfer section 106 is condensed again and liquefied. In this embodiment, the condensation section 108 has the shape of a ring having two branches distanced from the evaporation section 104 on the same plane. As shown in the drawing, the condensation section 108 has the two branches at the branching section, so that the fan 120 can be disposed between them. When the fan 120 turns around to bring into the air from the outside of the condensation section 108, the heat from the gaseous state refrigerant reaching the condensation section 108 can be easily dissipated, which causes the refrigerant to be condensed and liquefied.

Although the condensation section 108 has the shape of a ring having two branches in this embodiment, the branching section may have the form of a lozenge as a whole (cf. FIG. 13). Since the fan 120 is disposed between the branches, a structure for increasing the heat dissipation efficiency can be achieved.

Meanwhile, the condensation section 108 may include a plurality of tiny channels (not shown) similar to the tiny channels formed in the evaporation section 104. The tiny channels of the condensation section 108, as below, may be formed to extend to the liquid state refrigerant transfer section 110, and further to the liquid state refrigerant transfer section 102 near the evaporation section. The tiny channels of the condensation section 108 make the condensation of the refrigerant easy, and provide the surface tension, which causes the liquefied refrigerant to be transferred towards the liquid state refrigerant transfer section 102 near the evaporation section, to the refrigerant so as to accelerate the completion of the refrigerant circulation loop.

The depth of the tiny channels of the condensation section 108 is preferably deeper than that of the tiny channels of the evaporation section 104, which is however not limited to this. In addition, the shape and change of the cross-sections, the formation of the grooves or nodes of the tiny channels of the condensation section 108 will not described in detail because they are similar to those of the tiny channels of the evaporation section 104.

Moreover, in order to increase the efficiency of the heat dissipation, a plurality of fins may be formed outside the condensation section 108 of the phase transition cooler 112 (cf. FIGS. 4 to 6). The fins may have a radial shape or other shapes outside the condensation section 108. The air brought by the fan 120 touches the inner wall of the fins facing each other, which can maximize the heat dissipation efficiency. Alternatively, a plurality of phase transition coolers 112 may be laminated, and in this case, the laminated phase transition coolers 112 are provided with fins therebetween. Since the temperature distribution inside the fins is uniform, the cooling performance can be further improved.

Further, if the fins include micro actuators, the air surrounding the cooling device may be circulated utilizing the heat dissipated from the condensation section 108. If the fins have a tiny structure including thermoelectric conversion devices, the heat dissipated from the condensation section 108 is converted into electricity which can be used as the energy for tiny driving.

In addition, the volume of the condensation section 108 may be larger than that of the evaporation section 104, which can achieve an additional effect of the condensation by the surface area enlarged.

The liquid state refrigerant transfer section 110 is disposed around the condensation section 108, and forms a passage through which the liquefied refrigerant condensed in the condensation section 108 is transferred towards the liquid state refrigerant transfer section 102 near the evaporation section. As shown in the drawing, the liquid state refrigerant transfer section 110 is thermally insulated and separated from the gaseous state refrigerant transfer section 106, the condensation section 108 and the evaporation section 104 by the thermal insulation section 116.

The thermal insulation section 116 may be formed as partitions inside the phase transition cooler 112, spaces internally sealed in the phase transition cooler 112, or openings vertically penetrating the phase transition cooler 112. If the thermal insulation section 116 is the spaces internally sealed in the phase transition cooler 112, it may be in a vacuum state or filled with an insulation substance such as air.

As shown in the drawing, the liquid state refrigerant transfer section 110 is preferably symmetry along the longitudinal direction of the phase transition cooler 112. The refrigerant circulation loop being formed symmetry along the longitudinal direction of the phase transition cooler 112 is a structure which is very advantageous in dissipating heat if it has the shape of a thin plate, i.e. its sectional length-width ratio is large, so that the cooling device 100 can radially dissipate the heat transferred from the heat source utilizing the large surface area.

This bidirectional refrigerant circulation loop has an advantage that even though one of the refrigerant circulations in the liquid state refrigerant transfer section 110 is not properly performed because of the effect of gravity depending upon the installation position of the cooling device 100, the other refrigerant circulation can be maintained.

The liquid state refrigerant transfer section 110 may include tiny channels so as not to be affected by gravity, where a plurality of grooves (not shown) may be formed in the tiny channels in the direction facing the refrigerant storage section 102.

Meanwhile, a plurality of guides (not shown) may be formed to define the transfer direction of the liquefied refrigerant at a boundary between the liquid state refrigerant transfer section 102 near the evaporation section and the liquid state refrigerant transfer section 110 and a boundary between the condensation section 108 and the liquid state refrigerant transfer section 110, whereby the resistance of the refrigerant circulation occurring because the current path of the refrigerant rapidly curves can be reduced.

FIG. 3 shows an exploded perspective view of the hybrid cooling device 100 in FIG. 2. As shown in FIG. 3, the phase transition cooler 112 includes a lower housing 112a and an upper housing 112b. The structure described in connection with FIG. 2 is formed in the lower housing 112a, and then the upper housing 112b whose outer shape is the same is preferably bonded. Alternatively, the same structure as the lower housing 112a may be formed in the upper housing 112b as well.

Another embodiment of the present invention will now be described in detail referring to FIGS. 4 to 6.

FIG. 4a shows a perspective view of a hybrid cooling device 200 according to a second embodiment of the present invention, and FIG. 4b shows an enlarged perspective view of a condensation section of the hybrid cooling device 200. As shown in the drawings, a plurality of phase transition coolers 100a, 100b and 100c are arranged vertically in this embodiment. The heat from the external source is transferred to a region corresponding to the evaporation sections of the phase transition cooler 100a, 100b and 100c respectively in the thick arrow direction. For this, a heat transfer substance can be inserted between the phase transition coolers 100a, 100b and 100c.

In this embodiment, a plurality of fins 202 are radially formed outside the condensation sections of the phase transition coolers 100a, 100b and 100c, and a fan 120 is disposed in the middle space. Accordingly, unlike the conventional heat pipe module, the temperature distribution inside the fins is uniformly maintained, which maximizes the cooling performance. This multi-layer hybrid cooling device 200 can considerably increase the cooling efficiency of the external heat source.

Next, FIG. 5a shows a perspective view of a hybrid cooling device 220 according to a third embodiment of this invention, and FIG. 5b is a side view of the hybrid cooling device 220 in FIG. 5a. As shown in the drawings, the cooling device 220 in this embodiment is formed by bonding the sections including the refrigerant storage sections and the evaporation sections of the phase transition coolers 100a, 100b and 100c shown in FIG. 4a. The sections including the condensation sections are not bonded but separated so as to maximize the ventilation effect by the fan 120, and the side structure of the phase transition coolers of the lowest and middle layers are consequently modified a little.

Meanwhile, in this embodiment, the liquid state refrigerant transfer sections near the evaporation sections and the evaporation sections, each of which is included in the three layer phase transition coolers, may be formed in common rather than independently. In this case, a predetermined region branches vertically at the evaporation sections or the gaseous state refrigerant transfer sections. If the evaporation sections are in common, a current path (not shown) towards each of the phase transition coolers is formed between the evaporation sections and the gaseous state refrigerant transfer sections, so that the refrigerant evaporated in the evaporation sections is transferred towards each layer.

Next, FIG. 6a shows a perspective view of a hybrid cooling device 230 according to a fourth embodiment of this invention, and FIG. 6b is a side view of the hybrid cooling device 230 in FIG. 6a. In this embodiment, the size of the fins shown in FIG. 5a is adjusted within the outline of the most upper and lower phase transition coolers. Accordingly, the cooling device 230 can be easily installed.

The hybrid cooling device of this invention described above can be manufactured by various methods widely known such as MIM (Metal Injection Molding), MEMS (Micro Electro Mechanical System), SAM (Self Assembled Monolayer), etc.

In MIM, upper and lower molds engraved with the shape of the phase transition cooler 112 are firstly formed, a melting material containing polymer and metal powder as a binder is injected into each of the molds, the molded body is separated from the molds, the binder is eliminated by a solvent and heat treatment, and lastly the upper and lower housings are bonded by metal bonding such as Brazing.

Alternatively, in case of manufacturing the cooling device of semiconductor referring to FIGS. 2 and 3, the surface of the lower housing 112a of the phase transition cooler 112 is etched to form the evaporation section 104, the tiny channels thereof, the gaseous state refrigerant transfer section 106, the condensation section 108 and the liquid state refrigerant transfer section 102 and 110. Then, the upper housing 112b is formed to have a regular pattern in response to the lower housing 112a, and they are boned. For example, after they touch each other, an anodic bonding may be performed by applying a voltage to them. Then, a predetermined amount of refrigerant is inserted into a refrigerant insertion hole (not shown) being formed at the phase transition cooler 112 being adjacent to the liquid state refrigerant transfer section 102 near the evaporation section in a vacuum state, and the refrigerant insertion hole is sealed.

Next, FIG. 7 shows a horizontally cross-sectional view of a hybrid cooling device 700 of a fifth embodiment. As shown in the drawing, the phase transition cooler 712 of the cooling device 700 of this embodiment has the form of a closed ring as a whole where both ends (shown as a dotted box) of the branches are connecting to each other. Also in this case, the refrigerant circulation loop is the same as that described in connection with FIG. 2, as well as the principle and effect thereof. Therefore, they will not be described in detail.

Although FIG. 7 shows that the phase transition cooler 712 of this embodiment does not include the guides 118 of the phase transition cooler 112 in the first embodiment, the guides 118 may be included or not depending upon its design.

Next, FIG. 8 shows a horizontally cross-sectional view of a hybrid cooling device 800 according to a sixth embodiment of the present invention. As shown in the drawing, in the cooling device 800 in this embodiment, the evaporation section 104 which absorbs the heat from the external source (not shown) and evaporates the liquid state refrigerant is disposed adjacent to the branching section near the center of the phase transition cooler 812.

According to this embodiment, the branching section consists of the condensation section 108 which condenses and liquefies the gaseous state refrigerant and the liquid state refrigerant transfer section 110 where the liquefied refrigerant is transferred again towards the evaporation section 104. Accordingly, the evaporation section 104 is disposed between the gaseous state refrigerant transfer section 106 and the branching section. Owing to this structure, the evaporated refrigerant is transferred from the evaporation section 104 to the opposite side of the branching section, and then reaches the branching section along the circumference of the housing. The fan 120 being disposed in the hollow of the branching section circulates the surrounding air, and then the gaseous state refrigerant reaching the branching section is condensed and liquefied. Accordingly in this embodiment, the condensation section 108 which condenses the gaseous state refrigerant is formed around the branching section.

Particularly in this embodiment, although the thermal insulation section for insulation of the evaporation section 104 from the liquid state refrigerant transfer section 110 is not additionally formed, there is no problem in circulating the refrigerant. In other words, the gaseous state refrigerant flowing from the gaseous state refrigerant transfer section 106 eventually reaches the branching section, and the fan 120 takes away the heat from the gaseous state refrigerant to condense it.

The liquefied refrigerant continues traveling along the condensation section 108 formed around the branching section and the liquid state refrigerant transfer section 110, and then returns to the evaporation section 104 again. The condensation section 108 and the liquid state refrigerant transfer section 110 are sectioned by a partition 810. The partition 810 may additionally function as the thermal insulation section depending upon design.

Since the surrounding air which is circulated by the fan 120 continuously touches the branching section of the evaporation section 104, the external heat source itself can be cooled directly.

Also in this embodiment, both ends of the branches may be connected to each other. In addition, although FIG. 8 shows that the phase transition cooler 812 of this embodiment does not include the guides 118 of the phase transition cooler 112 in the first embodiment, the guides 118 may be included or not depending on its design.

Next, FIG. 9 shows a horizontally cross-sectional view of a hybrid cooling device 800 according to a seventh embodiment of the present invention. As shown in the drawing, the phase transition cooler 912 of the cooling device 900 in this embodiment has the form of a closed ring where the branches are connecting, and has a structure of an asymmetrically unidirectional circulation rather than the symmetrical circulation loop.

In other words, the phase transition cooler 912 includes an evaporation section 104 being formed at one end thereof, a gaseous state refrigerant transfer section 106 where the evaporated refrigerant is transferred from the evaporation section 104 in a predetermined direction, a branching section 108 in the shape of a ring having a space in the middle thereof where the gaseous state refrigerant flowing inwards is condensed at one end thereof and the condensed liquid state refrigerant is transferred in a predetermined direction and flows out of the other end thereof, and a liquid state refrigerant transfer section 102 being formed adjacent to the other end of the branching section 108 where the liquid state refrigerant is continuously transferred towards the evaporation section 104. The evaporation section 104 and the gaseous state refrigerant transfer section 106 are separated from the liquid state refrigerant transfer section 102 by a partition 116. The partition 116 may be formed to function as a thermal insulation section.

The cooling device 100 of this embodiment is similar to that of the first embodiment, except that the refrigerant circulation loop is asymmetrical, and the heat source is disposed beneath the evaporation section a little out of the middle of the housing so that the heat from the heat source can be absorbed to the evaporation section 104, and thus it will not described in detail.

Next, FIG. 10 shows a horizontally cross-sectional view of a hybrid cooling device 1000 according to an eighth embodiment of the present invention. As shown in the drawing, the phase transition cooler 1012 of the cooling device 1000 in this embodiment has the refrigerant circulation loop of the opposite direction to that of the phase transition cooler 912 of the seventh embodiment.

In other words, the evaporation section 104 which evaporates the refrigerant is formed in a region adjacent to the branching section 108 so that the evaporated refrigerant is transferred in the opposite direction of the branching section 108, whereby the evaporated refrigerant flows into one end of the branching section 108 through the gaseous state refrigerant transfer section 106. The refrigerant flowing inwards is condensed and liquefied by the air circulation by the fan 120 being formed in the hollow of the branching section 108. The liquefied refrigerant flows into the evaporation section 104 again through the branching section 108.

Also in this embodiment, as described in connection with FIG. 8, the evaporation section 104 is disposed near the fan 120, so that the surrounding air circulated by the fan 120 can cool the external source itself. In addition, the external source is preferably disposed beneath the evaporation section 104.

Next, FIG. 11 shows a horizontally cross-sectional view of a hybrid cooling device 1100 according to a ninth embodiment of the present invention. As shown in the drawing, the cooling device 1100 in this embodiment includes a pair of phase transition coolers 1112a and 1112b, each of which has one end being curved by a predetermined angle so as to form at least a part of a hollow branching section. According to this embodiment, the curved sections of the pair of phase transition coolers 1112a and 1112b form the branching section when installed. The fan 120 is installed in the hollow of the branching section.

As shown in FIG. 11, each of the phase transition coolers 1112a and 1112b of this embodiment is a heat pipe. In this case, since each of the pair of heat pipes 1112a and 1112b itself functions as a cooler based on phase transition, it can absorb and dissipate the heat from the external source. Moreover, according to this invention, since a part of the coolers, i.e. the region where condensation occurs (shown as the dotted line 108) has the form of a ring being bent by a predetermined angle, and the fan 120 is installed in a space in the middle thereof to circulate the surrounding air, it is possible to achieve heat dissipation capacity far more than that of the conventional heat pipe.

Each of the pair of phase transition coolers 1112a and 1112b is not necessarily a heat pipe. Such embodiment is shown in FIG. 12a. FIG. 12a shows a horizontally cross-sectional view of a hybrid cooling device 1200 according to a tenth embodiment of the present invention. The cooling device 1200 of this embodiment also includes a pair of phase transition coolers 1212a and 1212b constituting the branching section having a space in the middle thereof when installed, and a fan 120 being disposed in the middle space of the branching section consisting of the pair of phase transition coolers 1212a and 1212b. Moreover, each of phase transition coolers 1212a and 1212b in this embodiment has its sections 108 and 110 at its end ("one end") being bent by a predetermined angle, where a circulation loop of a refrigerant capable of phase transition is formed, and includes an evaporation section 104 where the liquid state refrigerant is accumulated by capillary action in at least a part thereof and the accumulated liquid state refrigerant is evaporated by the heat from an external heat source (not shown), a gaseous state refrigerant transfer section 106 being formed adjacent to the evaporation section 104 where the evaporated refrigerant is transferred towards the one end 108 and 110, a condensation section 108 being disposed adjacent to the gaseous state refrigerant transfer section 106 and forming at least a part of the one end, where the gaseous state refrigerant flows into one side thereof and is condensed, a liquid state refrigerant transfer section 110 being disposed adjacent to the condensation section 108 and forming at least a part of the one end, where the liquid state refrigerant is transferred towards the evaporation section 104, and a thermal insulation section 106 for at least partial insulation of the evaporation section 104 from the liquid state refrigerant transfer section 110.

Meanwhile, FIG. 12b shows a horizontally cross-sectional view of a hybrid cooling device 1200' according to an eleventh embodiment of the present invention. In this embodiment, like the fifth embodiment shown in FIG. 7, both ends of the branches are connecting to each other. Also in this embodiment, the circulation of the refrigerant is the same as that of the tenth embodiment.

Accordingly, the cooling devices 1200 and 1200' of these embodiments mainly have the advantages of the cooling devices of the embodiments shown in FIGS. 2 and 9. Further, according to these embodiments, since the evaporation sections are separately formed up and down, the heat from a plurality of heat sources being separately installed can be dissipated. In addition, since the evaporation sections of the phase transition coolers in the tenth and eleventh embodiments are formed adjacent to each other, a heat source of a larger area can be cooled. Other internal structures are changed in response to the position change of the evaporation section.

Meanwhile, the evaporation sections 104 of the tenth and eleventh embodiments are formed at the branching section side, whereby the effect of the phase transition cooler 800 shown in FIG. 8 can also be achieved. In other words, the cooling device (not shown) of this case also includes a pair of phase transition coolers, which form the branching section having a space in the middle thereof, and the fan being installed in the middle space of the branching section formed by the pair of phase transition coolers. Moreover, each of the phase transition coolers of this embodiment has its one end being bent by a predetermined angle where a circulation loop of a refrigerant capable of phase transition is formed, and includes an evaporation section where the liquid state refrigerant is accumulated by capillary action in at least a part thereof and the accumulated liquid state refrigerant is evaporated by the heat from an external heat source, a gaseous state refrigerant transfer section being formed adjacent to the evaporation section where the evaporated refrigerant is transferred in the opposite direction of the bent one end, a condensation section being disposed adjacent to the bent one end and forming at least a part of the bent one end, where the gaseous state refrigerant flows into one side thereof and is condensed, and a liquid state refrigerant transfer section being disposed adjacent to the condensation section and forming at least a part of the bent one end, where the liquid state refrigerant is transferred towards the evaporation section.

The cooling device of this embodiment mainly has the advantages of the cooling devices of the embodiments shown in FIGS. 2 and 10. Further, according to this embodiment, since the evaporation sections are separately formed up and down, the heat from a plurality of heat sources being separately installed can be dissipated. In addition, since the evaporation sections of the phase transition coolers in this embodiment are formed adjacent to each other, a heat source of larger area can be cooled. Other internal structures are changed in response to the position change of the evaporation section.

The cooling devices shown in FIGS. 7 to 12, like the cooling device 100 described in connection with FIG. 2, can also be formed as multi-layer phase transition coolers. Further, the branching section may also be provided with a plurality of fins to improve the cooling efficiency.

In addition, the gaseous state refrigerant may exist in the form of bubbles in the condensation section or the liquid state refrigerant transfer section of the phase transition cooler. These bubbles exist a lot in the condensation section, and in order to discriminate them they are separately shown as hatched and waved regions, but the regional separation is not limited to this illustration.

Moreover, tiny channels similar to those of the evaporation section may be formed in the condensation section or the liquid state refrigerant transfer section, whereby the condensed and liquefied refrigerant can be easily transferred.

Next, FIGS. 13a to 13f show cooling devices according to other embodiments of the present invention. As shown in the drawings, the branching sections of the cooling devices of the present invention are not necessarily the shape of a circular ring, and may be a linear shape (cf. FIG. 13a or 13d), a lozenge shape with its end being open or closed (cf. FIGS. 13b, 13c, 13e and 13f), etc. Accordingly, the shape of the branching section is merely an optional matter in design, and thus it is obvious that the technical ideas of the present invention are not limited to a specific shape of the branching section.

Although the present invention has been described by way of exemplary embodiments, it should be understood that those skilled in the art might make many changes and substitutions without departing from the spirit and the scope of the present invention which is defined only by the appended claims. For example, although the tiny channels are linear in the above embodiments, they may be curved, and the size of the thermal insulation section 116 may be properly designed as well as the shape thereof.

INDUSTRIAL APPLICABILITY

According to present invention, cooling is performed based on both the latent heat in phase transition and ventilation and convection.

In addition, according to present invention, since a plurality of phase transition coolers are laminated between fins of each layer to maximize the cooling efficiency of the fins, the cooling performance is considerably improved even using fins of the same area as the conventional fins.

In addition, according to present invention, it is possible to provide a compact type hybrid cooling device capable of conducting its cooling performance regardless of gravity.

In addition, according to present invention, it is possible to provide a compact type hybrid cooling device without restriction in its installation location or position.

In addition, according to present invention, since the refrigerant is naturally circulated hardly affected by gravity, if the surface tension in the tiny channels between the evaporation and condensation sections is larger than gravity, the position and method of the installation are not restricted.

In addition, according to present invention, since the thermal insulation section thermally and physically insulates the liquid state refrigerant transfer section from the gaseous state refrigerant transfer section, the refrigerant current can be stabilized, and the cooling efficiency can be improved.

In addition, according to present invention, the liquid state refrigerant transfer sections are disposed along both lateral circumstances of the cooling device, and bidirectional circulation loops are formed, thereby increasing super cooling of the refrigerant, and if the refrigerant cannot properly circulate in one of the liquid state refrigerant transfer sections due to gravity head, the refrigerant flows through the opposite liquid state refrigerant transfer section, thereby increasing the cooling efficiency.

The invention claimed is:

1. A hybrid cooling device for cooling heat from an external heat source, comprising:
    a phase transition cooler in which a circulation loop of a refrigerant capable of phase transition is formed, said phase transition cooler comprising a branching section at one side thereof; and
    a fan being disposed in said branching section of said phase transition cooler,
    wherein said phase transition cooler comprises:
        an evaporation section being formed at one end of said phase transition cooler, where said liquid state refrigerant is accumulated by capillary action in at least a part of said evaporation section, and said accumulated liquid state refrigerant is evaporated by heat transferred from said external heat source;
        a gaseous state refrigerant transfer section being formed adjacent to said evaporation section, where said evaporated refrigerant is transferred towards said branching section;
        a condensation section being formed adjacent to the gaseous state refrigerant transfer section as at least a part of said branching section and dividing into at least two branches, where said gaseous state refrigerant is condensed into a liquid state;
        a liquid state refrigerant transfer section being formed adjacent to said condensation section as at least a part of said branching section and thermally insulated from said evaporation section, where said liquefied refrigerant is transferred towards said evaporation section; and
        a thermal insulation section for thermally insulating at least a part of said evaporation section from said liquid state refrigerant transfer section.

2. A hybrid cooling device as claimed in claim 1, wherein at least a part of said liquid state refrigerant transfer section is a refrigerant storage section for storing said liquid state refrigerant.

3. A hybrid cooling device as claimed in claim 1, wherein said gaseous and liquid state refrigerant transfer sections are separated from each other by said thermal insulation section.

4. A hybrid cooling device as claimed in claim 1, wherein said liquid state refrigerant transfer section comprises at least one tiny channel whose surface tension between said liquid state refrigerant and an inner wall of said liquid state refrigerant transfer section is set to be larger than gravity.

5. A hybrid cooling device as claimed in claim 1, wherein said gaseous state refrigerant transfer section comprises a plurality of guides for transferring said gaseous state refrigerant towards said condensation section.

6. A hybrid cooling device as claimed in claim 1 further comprising a plurality of fins being formed at a region outside said phase transition cooler in response to said condensation section.

7. A hybrid cooling device as claimed in claim 6, wherein a cross-section on an X-Y plane of at least a part of said fins is curved.

8. A hybrid cooling device as claimed in claim 1 further comprising at least one of said phase transition cooler, wherein said phase transition coolers have said evaporation section in common.

9. A hybrid cooling device as claimed in claim 8 further comprising a refrigerant current path being formed from said evaporation section and vertically branching in order to transfer said gaseous state refrigerant evaporated in said common evaporation section towards each of said phase transition coolers.

10. A hybrid cooling device as claimed in claim 8 further comprising a refrigerant current path being formed from said gaseous state refrigerant transfer section and vertically branching in order to transfer said gaseous state refrigerant evaporated in said common evaporation section towards each of said phase transition coolers.

11. A hybrid cooling device as claimed in claim 1 further comprising at least one of said phase transition cooler, wherein said evaporation sections of said phase transition coolers are thermally connecting to each other.

12. A hybrid cooling device as claimed in claim 1, wherein ends of branches of said branching section are connecting to each other to form a closed ring.

13. A hybrid cooling device for cooling heat from an external heat source, comprising:
    a phase transition cooler in which a circulation loop of a refrigerant capable of phase transition is formed, said phase transition cooler comprising a branching section having at least two branches at one side thereof; and
    a fan being disposed in said branching section of said phase transition cooler,
    wherein said phase transition cooler comprises:
        an evaporation section being formed adjacent to said branching section, where said liquid state refrigerant is accumulated by capillary action in at least a part of said evaporation section, and said accumulated liquid state refrigerant is evaporated by heat transferred from said external heat source;

a gaseous state refrigerant transfer section being formed adjacent to said evaporation section, where said evaporated refrigerant is transferred in an opposite direction of said branching section;

a condensation section being formed in said branching section, where said gaseous state refrigerant flows inwards and is condensed into a liquid state; and a liquid state refrigerant transfer section being formed adjacent to said condensation section, where said liquefied refrigerant is transferred towards said evaporation section.

14. A hybrid cooling device as claimed in claim 13, wherein at least a part of said liquid state refrigerant transfer section is a refrigerant storage section for storing said liquid state refrigerant.

15. A hybrid cooling device as claimed in claim 13, wherein said liquid state refrigerant transfer section comprises at least one tiny channel whose surface tension between said liquid state refrigerant and an inner wall of said liquid state refrigerant transfer section is set to be larger than gravity.

16. A hybrid cooling device as claimed in claim 13, wherein said gaseous state refrigerant transfer section comprises a plurality of guides for transferring said gaseous state refrigerant towards said condensation section.

17. A hybrid cooling device as claimed in claim 13 further comprising a plurality of fins being formed at a region outside said phase transition cooler in response to said condensation section.

18. A hybrid cooling device as claimed in claim 17, wherein a cross-section on X-Y plane of at least a part of said fins is curved.

19. A hybrid cooling device as claimed in claim 13 further comprising at least one of said phase transition cooler,
wherein said phase transition coolers have said evaporation section in common.

20. A hybrid cooling device as claimed in claim 19 further comprising a refrigerant current path being formed from said evaporation section and vertically branching in order to transfer said gaseous state refrigerant evaporated in said common evaporation section towards each of said phase transition coolers.

21. A hybrid cooling device as claimed in claim 19 further comprising a refrigerant current path being formed from said gaseous state refrigerant transfer section and vertically branching in order to transfer said gaseous state refrigerant evaporated in said common evaporation section towards each of said phase transition coolers.

22. A hybrid cooling device as claimed in claim 13 further comprising at least one of said phase transition cooler,
wherein said evaporation sections of said phase transition coolers are thermally connecting to each other.

23. A hybrid cooling device as claimed in claim 13, wherein ends of branches of said branching section are connecting to each other to form a closed ring.

24. A hybrid cooling device for cooling heat from an external heat source, comprising:
(a) a phase transition cooler in which a circulation loop of a refrigerant capable of phase transition is formed, said phase transition cooler comprising:
a-1) an evaporation section being formed at one end of said phase transition cooler, where said liquid state refrigerant is accumulated by capillary action in at least a part of said evaporation section, and said accumulated liquid state refrigerant is evaporated by heat transferred from said external heat source;

a-2) a gaseous state refrigerant transfer section being formed adjacent to said evaporation section, where said evaporated refrigerant is transferred in a predetermined direction by a pressure difference thereof;

a-3) a branching section being formed adjacent to said gaseous state refrigerant transfer section opposite said evaporation section and having a space in the middle thereof, where said gaseous state refrigerant flows into one side thereof and is condensed, and said condensed and liquefied refrigerant is transferred in a predetermined direction and flows out of other side thereof;

a-4) a liquid state refrigerant transfer section being formed adjacent to said other side of said branching section, where said liquefied refrigerant is transferred towards said evaporation section; and, a-5) a thermal insulation section for thermally insulating at least a part of said evaporation section from said liquid state refrigerant transfer section, and (b) a fan being disposed in said middle space of said branching section of said phase transition cooler.

25. A hybrid cooling device for cooling heat from an external heat source, comprising:
(a) a phase transition cooler in which a circulation loop of a refrigerant capable of phase transition is formed, said phase transition cooler comprising:
a-1) an evaporation section being formed at one end of said phase transition cooler, where said liquid state refrigerant is accumulated by capillary action in at least a part of said evaporation section, and said accumulated liquid state refrigerant is evaporated by heat transferred from said external heat source;

a-2) a gaseous state refrigerant transfer section being formed adjacent to said evaporation section, where said evaporated refrigerant is transferred in a predetermined direction by a pressure difference thereof; and a-3) a branching section being formed adjacent to said evaporation section opposite said gaseous state refrigerant transfer section and having a space in the middle thereof, where said gaseous state refrigerant flows into one side thereof and is condensed, and said condensed and liquefied refrigerant is transferred in a predetermined direction and flows out of said evaporation section, and (b) a fan being disposed in said middle space of said branching section of said phase transition cooler.

26. A hybrid cooling device for cooling heat from an external heat source, comprising:
a pair of heat pipes, each of which comprises one end being bent by a predetermined angle, and forms a branching section having a space in the middle thereof when installed; and a fan being disposed in said middle space of said branching section formed by bent sections of said heat pipes.

27. A hybrid cooling device for cooling heat from an external heat source, comprising:
a pair of phase transition coolers, each of which comprises one end being bent by a predetermined angle, and forms a branching section having a space in the middle thereof when installed; and a fan being disposed in said middle space of said branching section formed by bent sections of said phase transition coolers, wherein a circulation loop of a refrigerant capable of phase transition is formed in each of said phase transition coolers, said each of phase transition coolers comprising:
- a-1) an evaporation section being formed at one end of said phase transition cooler, where said liquid state refrigerant is accumulated by capillary action in at least a part of said evaporation section, and said accumulated liquid state refrigerant is evaporated by heat transferred from said external heat source;
- a-2) a gaseous state refrigerant transfer section being formed adjacent to said evaporation section, where said evaporated refrigerant is transferred towards said branching section;
- a-3) a condensation section being formed adjacent to said gaseous state refrigerant transfer section to form at least a part of said branching section, where said gaseous state refrigerant flows into one side thereof and is condensed;
- a-4) a liquid state refrigerant transfer section being formed adjacent to said condensation section in order to form at least a part of said branching section, where said liquefied refrigerant is transferred towards said evaporation section; and
- a-5) a thermal insulation section for thermally insulating at least a part of said evaporation section from said liquid state refrigerant transfer section.

28. A hybrid cooling device for cooling heat from an external heat source, comprising:
a pair of phase transition coolers, each of which comprises one end being bent by a predetermined angle, and forms a branching section having a space in the middle thereof when installed; and
a fan being disposed in said middle space of said branching section formed by said bent sections of said pair of phase transition coolers,
wherein a circulation loop of a refrigerant capable of phase transition is formed in each of said phase transition coolers, said each of phase transition coolers comprising:
- a-1) an evaporation section being formed at one end of said phase transition cooler, where said liquid state refrigerant is accumulated by capillary action in at least a part of said evaporation section, and said accumulated liquid state refrigerant is evaporated by heat transferred from said external heat source;
- a-2) a gaseous state refrigerant transfer section being formed adjacent to said evaporation section, where said evaporated refrigerant is transferred in an opposite direction of said branching section;
- a-3) a condensation section being formed adjacent to said branching section to form at least a part of said branching section, where said gaseous state refrigerant flows into one side thereof and is condensed; and
- a-4) a liquid state refrigerant transfer section being formed adjacent to said condensation section in order to form at least a part of said branching section, where said liquefied refrigerant is transferred towards said evaporation section.

* * * * *